(12) United States Patent
Fujioto

(10) Patent No.: US 9,875,904 B2
(45) Date of Patent: Jan. 23, 2018

(54) SILICON ETCHING LIQUID, SILICON ETCHING METHOD, AND MICROELECTROMECHANICAL ELEMENT

(71) Applicant: MITSUBISHI GAS CHEMICAL COMPANY, INC., Tokyo (JP)

(72) Inventor: Yoshiko Fujioto, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 103 days.

(21) Appl. No.: 14/760,064

(22) PCT Filed: Jan. 10, 2014

(86) PCT No.: PCT/JP2014/050279
§ 371 (c)(1),
(2) Date: Jul. 9, 2015

(87) PCT Pub. No.: WO2014/112430
PCT Pub. Date: Jul. 24, 2014

(65) Prior Publication Data
US 2015/0340241 A1    Nov. 26, 2015

(30) Foreign Application Priority Data
Jan. 15, 2013 (JP) .................. 2013-004410

(51) Int. Cl.
| C09K 13/00 | (2006.01) |
| H01L 21/306 | (2006.01) |
| B81C 1/00 | (2006.01) |
| C09K 13/02 | (2006.01) |
| C09K 13/08 | (2006.01) |

(52) U.S. Cl.
CPC .... H01L 21/30608 (2013.01); B81C 1/00539 (2013.01); C09K 13/02 (2013.01); C09K 13/08 (2013.01)

(58) Field of Classification Search
CPC ... C09K 13/02; C09K 13/06; H01L 21/30608; H01L 21/30317
USPC ...................................... 252/79.1, 79.4, 79.5
See application file for complete search history.

(56) References Cited

U.S. PATENT DOCUMENTS

| 4,614,568 | A | 9/1986 | Okubo et al. | |
| 5,141,730 | A | 8/1992 | Heitner | |
| 5,955,244 | A | 9/1999 | Duval | |
| 6,162,200 | A | 12/2000 | Ishikura et al. | |
| 6,162,366 | A | 12/2000 | Ishikura et al. | |
| 2008/0011981 | A1* | 1/2008 | Kuriyama | C23F 1/28 252/79.4 |
| 2008/0073614 | A1* | 3/2008 | Akiyama | C23F 1/30 252/79.3 |
| 2009/0218542 | A1 | 9/2009 | Isami et al. | |
| 2010/0206737 | A1* | 8/2010 | Preisser | C25D 3/38 205/123 |
| 2012/0190210 | A1* | 7/2012 | Fujioto | H01L 21/30608 438/753 |
| 2012/0225563 | A1 | 9/2012 | Sotoaka et al. | |
| 2014/0065836 | A1 | 3/2014 | Toben et al. | |

FOREIGN PATENT DOCUMENTS

| EP | 0 516 933 | 12/1992 | |
| EP | 1 626 438 | 2/2006 | |
| EP | 2 500 930 | 9/2012 | |
| GB | 898328 A * | 6/1962 | ............. G03C 5/383 |
| JP | 1-24231 | 5/1989 | |
| JP | 5-170723 | 7/1993 | |
| JP | 7-113179 | 5/1995 | |
| JP | 2000-104183 | 4/2000 | |
| JP | 2000-516355 | 12/2000 | |
| JP | 2006-54363 | 2/2006 | |
| JP | 2006-186329 | 7/2006 | |
| JP | 2006-351813 | 12/2006 | |
| JP | 2007-214456 | 8/2007 | |
| JP | 2009-117504 | 5/2009 | |
| JP | 2009-123798 | 6/2009 | |

(Continued)

OTHER PUBLICATIONS

Hiroshi Tanaka et al., "Silicon Wet Anisotropic Etching by Controlling the Ppb-level of Impurities in the Solution", Denso Technical View, 2000, pp. 56-61, vol. 5, No. 1.

(Continued)

Primary Examiner — Binh X Tran
(74) Attorney, Agent, or Firm — Greenblum & Bernstein, P.L.C.

(57) ABSTRACT

The present invention is able to provide: a silicon etching liquid which anisotropically dissolves single crystal silicon, and which is characterized by containing (1) potassium hydroxide or sodium hydroxide, (2) a hydroxyl amine and (3) a cyclic compound represented by general formula (I), which has a thiourea group and wherein N and N' are linked; and a silicon etching method which uses this silicon etching liquid.

(I)

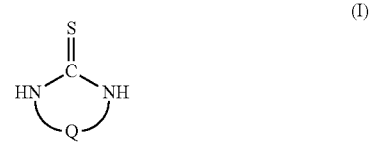

(In general formula (I), Q represents an organic group having a saturated or unsaturated carbon-carbon bond.) By using the above-described silicon etching liquid, high etching rate can be achieved without lowering the etching rate of silicon and stability of the etching liquid is not impaired even in cases where copper is present in the etching liquid and/or where copper ions are dissolved in the etching liquid.

3 Claims, No Drawings

(56) References Cited

FOREIGN PATENT DOCUMENTS

| | | | | |
|---|---|---|---|---|
| JP | 2009-206335 | 9/2009 | | |
| JP | 2014-060394 | 4/2014 | | |
| WO | 2011/040484 | 4/2011 | | |
| WO | WO 2011040484 A1 * | 4/2011 | ............. | C09K 13/02 |
| WO | 2011/055825 | 5/2011 | | |

OTHER PUBLICATIONS

European Search Report for Patent Application No. PCT/JP2014/050279., dated Apr. 15, 2014.

* cited by examiner

SILICON ETCHING LIQUID, SILICON ETCHING METHOD, AND MICROELECTROMECHANICAL ELEMENT

TECHNICAL FIELD

The present invention relates to etching of silicon, and particularly relates to a silicon etching liquid and a silicon etching method to be used for the production of parts of microelectromechanical elements (MEMS) and semiconductor devices.

BACKGROUND ART

In general, when etching a silicon single crystal substrate with a chemical liquid, there are two methods, i.e., a method of etching with an acid-based etching liquid which is a mixed aqueous solution obtained by adding components such as hydrofluoric acid and nitric acid, and a method of etching with an alkali-based etching liquid which is an aqueous solution of potassium hydroxide (KOH), tetramethylammonium hydroxide (TMAH) or the like.

When using the acid-based etching liquid, the silicon surface is oxidized by a component having oxidizing properties such as nitric acid to generate silicon oxide, and this silicon oxide is dissolved by hydrofluoric acid or the like in the form of silicon fluoride, and thus etching is progressed. Etching with the acid-based etching liquid is characterized in that etching is isotropically progressed. The etching rate of the acid-based etching liquid varies depending on the mixing ratio between hydrofluoric acid and nitric acid and is about 1 to 100 μm/min. However, since the acid-based etching liquid corrodes metal wiring of copper, aluminium or the like, it is difficult to use the liquid in a process in which a metal coexists.

Meanwhile, when using the alkali-based etching liquid, silicon is dissolved by hydroxy anion in the liquid in the form of silicate ion, and at this time, water is reduced to generate hydrogen. Unlike the acid-based etching liquid, when etching with the alkali-based etching liquid, etching of single crystal silicon is anisotropically progressed. This is based on the difference of silicon dissolution rate among crystal face orientations of silicon, and is called "crystal anisotropic etching". Even in the case of polycrystal, microscopically, etching is progressed with anisotropy being maintained, but since face orientations of crystal grains are randomly distributed, macroscopically, it appears that isotropic etching is progressed. In the case of amorphous, isotropic etching is progressed both microscopically and macroscopically.

As alkaline etching liquids, in addition to aqueous solutions of KOH and TMAH, aqueous solutions of sodium hydroxide (NaOH), ammonia, hydrazine, etc. are also used. In the process of etching a substrate of single crystal silicon using these aqueous solutions, a long period of processing time in the range of from several hours to several ten hours is often required though it depends on a desired processing shape, temperature conditions for the treatment, etc.

For the purpose of reducing the above-described processing time, chemical liquids showing a high etching rate have been developed. For example, Patent Document 1 discloses a technique of using an aqueous solution obtained by adding hydroxylamines to TMAH as an etching liquid.

Patent Document 2 discloses a technique of using an aqueous solution obtained by adding a specific compound such as iron, iron (III) chloride and iron (II) hydroxide to TMAH as an etching liquid. The document also discloses that a particularly preferable etching rate is obtained by combined use of iron and hydroxylamine.

Patent Document 3 discloses a technique of using an aqueous solution obtained by adding hydroxylamines to KOH as an etching liquid.

Patent Document 4 discloses an etching liquid consisting of an alkaline reducing compound and an anticorrosive (sugar, sugar alcohol, catechol, etc.).

Patent Document 5 discloses a technique of suppressing decomposition of hydroxylamine by means of addition of an acid to an alkali.

Patent Document 6 discloses a technique of suppressing decomposition of hydroxylamine by means of addition of an alkali salt to an alkali and hydroxylamine.

Patent Document 7 is mentioned as a patent comprising KOH, hydroxylamine and urea, but the patent relates to the development of a photoresist, and the document does not describe any silicon etching liquid or silicon etching method. In addition, the document does not describe any cyclic compound having a specific structure, which has a thiourea group and wherein N and N' are linked.

Patent Document 8 discloses a silicon etching liquid, which anisotropically dissolves single crystal silicon, and which is an alkaline aqueous solution containing (1) at least one alkaline hydroxide selected from potassium hydroxide, sodium hydroxide and tetramethylammonium hydroxide, (2) a hydroxylamine and (3) a thiourea group. However, the document does not describe any cyclic compound having a specific structure, which has a thiourea group and wherein N and N' are linked.

PRIOR ART DOCUMENTS

Patent Documents

Patent Document 1: Japanese Laid-Open Patent Publication No. 2006-054363
Patent Document 2: Japanese Laid-Open Patent Publication No. 2006-186329
Patent Document 3: Japanese Laid-Open Patent Publication No. 2006-351813
Patent Document 4: Japanese Laid-Open Patent Publication No. 2007-214456
Patent Document 5: Japanese Laid-Open Patent Publication No. 2009-117504
Patent Document 6: Japanese Laid-Open Patent Publication No. 2009-123798
Patent Document 7: Japanese Laid-Open Patent Publication No. 2000-516355
Patent Document 8: International Publication WO2011/040484 pamphlet

Non-Patent Documents

Non-Patent Document 1: Tanaka, Abe, Yoneyama, Inoue, "Silicon anisotropic etching controlling impurities of ppb order", Denso Technical Review, Vol. 5, No. 1, 2000, pp. 56-61

SUMMARY OF THE INVENTION

Problems to be Solved by the Invention

An alkali etching liquid containing hydroxylamine as shown in Patent Document 1 is characterized in that the etching rate is significantly improved compared to an alkali etching liquid not containing hydroxylamine, but hydroxylamine may be decomposed when heating the etching liquid for a long period of time.

Further, regarding etching of Si (110), it is known that the etching rate is significantly reduced when copper or copper ions exist (Non-patent Document 1).

Recently, in the production process of semiconductor devices or MEMS parts, use of copper as a wiring material has become more popular. The alkali-based etching liquid containing hydroxylamine is characterized in that the etching rate of silicon is high, but has a drawback that the etching rate of silicon is significantly reduced when a semiconductor substrate having copper wiring, etc. is immersed in the etching liquid.

The objective of the present invention is to solve at least one of the above-described conventional problems. In particular, the objective of the present invention is to provide an etching liquid containing hydroxylamine, wherein a high etching rate is maintained and stability of the etching liquid is not impaired even in cases where copper exists in a semiconductor substrate when etching silicon with the etching liquid. In addition, another objective of the present invention is to provide a semiconductor substrate and MEMS having a silicon substrate processed according to an etching method using the etching liquid.

Means for Solving the Problems

The present inventors diligently made researches in order to solve the above-described problems, and found that when using an etching liquid, which contains: an alkali metal hydroxide; a hydroxylamine; and a cyclic compound having a specific structure, which has a thiourea group and wherein N and N' are linked, the etching rate of silicon is not lowered and the stability of the etching liquid is not impaired even when copper and/or copper ions exist, and thus the present invention was achieved. Specifically, the present invention relates to a silicon etching liquid, a silicon etching method and MEMS as follows:

<1> A silicon etching liquid, which anisotropically dissolves single crystal silicon, and which contains (1) potassium hydroxide or sodium hydroxide, (2) a hydroxylamine and (3) a cyclic compound represented by general formula (I), which has a thiourea group and wherein N and N' are linked:

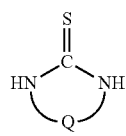

(I)

wherein in general formula (I), Q represents an organic group having a saturated or unsaturated carbon-carbon bond.

<2> The silicon etching liquid according to item <1>, wherein said (3) the cyclic compound represented by general formula (I), which has a thiourea group and wherein N and N' are linked, is at least one selected from the group consisting of ethylenethiourea, propylenethiourea, 2-thiouracil, 2-thiobarbituric acid, 6-methyl-2-thiouracil, 5-butyl-6-ethyl-2-thiouracil, 5-butyl-6-methyl-2-thiouracil, 5-butyl-6-propyl-2-thiouracil, 5,6-dimethyl-2-thiouracil, 6-methyl-5-propyl-2-thiouracil, 5-propylthiouracil, 5-methyl-6-butyl-2-thiouracil, 5-hexyl-2-thiouracil, 5-ethyl-2-thiouracil, 1-methyl-2-thiouracil, 3-methyl-2-thiouracil, 1,3-dimethyl-2-thiouracil, 1,5-dimethyl-2-thiouracil, thiobarbital, 5-(2-methylpropyl)-5-ethyl-2-thiobarbituric acid, 1,3-diethyl-2-thiobarbituric acid, 1,3,5-trimethyl-2-thiobarbituric acid and 1,3-dimethyl-2-thiobarbituric acid.

<3> The silicon etching liquid according to item <1>, wherein said (3) the cyclic compound represented by general formula (I), which has a thiourea group and wherein N and N' are linked, is at least one selected from the group consisting of ethylenethiourea, propylenethiourea, 2-thiouracil and 2-thiobarbituric acid.

<4> The silicon etching liquid according to any one of items <1> to <3>, wherein the concentration of said (1) potassium hydroxide or sodium hydroxide is 7 to 45% by mass, the concentration of said (2) the hydroxylamine is 5 to 15% by mass and the concentration of said (3) the cyclic compound represented by general formula (I), which has a thiourea group and wherein N and N' are linked, is 0.00001 to 1.5% by mass.

<5> A silicon etching method, wherein single crystal silicon is anisotropically dissolved, and wherein a silicon etching liquid, which contains (1) an alkali metal hydroxide, (2) a hydroxylamine and (3) a cyclic compound represented by general formula (I), which has a thiourea group and wherein N and N' are linked, is used:

(I)

wherein in general formula (I), Q represents an organic group having a saturated or unsaturated carbon-carbon bond.

<6> The silicon etching method according to item <5>, wherein said (1) the alkali metal hydroxide is at least one selected from potassium hydroxide and sodium hydroxide, and wherein said (3) the cyclic compound represented by general formula (I), which has a thiourea group and wherein N and N' are linked, is at least one selected from the group consisting of ethylenethiourea, propylenethiourea, 2-thiouracil, 2-thiobarbituric acid, 6-methyl-2-thiouracil, 5-butyl-6-ethyl-2-thiouracil, 5-butyl-6-methyl-2-thiouracil, 5-butyl-6-propyl-2-thiouracil, 5,6-dimethyl-2-thiouracil, 6-methyl-5-propyl-2-thiouracil, 5-propylthiouracil, 5-methyl-6-butyl-2-thiouracil, 5-hexyl-2-thiouracil, 5-ethyl-2-thiouracil, 1-methyl-2-thiouracil, 3-methyl-2-thiouracil, 1,3-dimethyl-2-thiouracil, 1,5-dimethyl-2-thiouracil, thiobarbital, 5-(2-methylpropyl)-5-ethyl-2-thiobarbituric acid, 1,3-diethyl-2-thiobarbituric acid, 1,3,5-trimethyl-2-thiobarbituric acid and 1,3-dimethyl-2-thiobarbituric acid.

<7> The silicon etching method according to item <5> or <6>, wherein the concentration of said (1) the alkali metal hydroxide is 7 to 45% by mass, the concentration of said (2) the hydroxylamine is 5 to 15% by mass and the concentration of said (3) the cyclic compound represented by general formula (I), which has a thiourea group and wherein N and N' are linked, is 0.00001 to 1.5% by mass.

<8> A microelectromechanical element produced with use of the silicon etching liquid according to any one of items <1> to <4>.

Advantageous Effect of the Invention

According to the present invention, it is possible to provide an etching liquid, wherein a high silicon etching rate is exerted and stability of the etching liquid is not impaired even in cases where copper and/or copper ions further exist in the etching liquid when etching silicon of a silicon substrate including copper and copper wiring therein or silicon substrate having copper and copper wiring thereon using an alkaline aqueous solution containing hydroxylamine. It is considered that this is because the compound having a thiourea group to be used in the present invention has a cyclic structure, leading to difficulty in decomposition.

EMBODIMENTS FOR CARRYING OUT THE INVENTION

Hereinafter, the present invention will be described in detail.

The concentration of the hydroxylamine to be used in the present invention can be suitably determined depending on the desired etching rate of silicon, and is preferably 5 to 15% by mass relative to the total amount of the silicon etching liquid. The concentration is more preferably 7 to 13% by mass, and particularly preferably 9 to 11% by mass. When the concentration is 5 to 15% by mass, silicon can be etched effectively.

As the alkali metal hydroxide to be used in the present invention, potassium hydroxide, sodium hydroxide and calcium hydroxide are preferred, and potassium hydroxide is particularly preferred. The concentration of the alkali metal hydroxide to be used in the present invention may be a conventional alkali compound concentration by which desired etching characteristics are obtained, but can also be suitably determined depending on the solubility of the alkali metal hydroxide in water and the concentration of the hydroxylamine and the concentration of thioureas in the etching liquid. The concentration is preferably 7 to 45% by mass, more preferably 10 to 40% by mass, and particularly preferably 15 to 35% by mass relative to the total amount of the silicon etching liquid. When the concentration is 7 to 45% by mass, silicon can be etched effectively.

In the present invention, a cyclic compound represented by general formula (I), which has a thiourea group and wherein N and N' are linked, is used:

(I)

wherein in general formula (I), Q represents an organic group having a saturated or unsaturated carbon-carbon bond.

As specific examples of the cyclic compound represented by general formula (I), which has a thiourea group and wherein N and N' are linked, preferred are ethylenethiourea, propylenethiourea, 2-thiouracil, 2-thiobarbituric acid, 6-methyl-2-thiouracil, 5-butyl-6-ethyl-2-thiouracil, 5-butyl-6-methyl-2-thiouracil, 5-butyl-6-propyl-2-thiouracil, 5,6-dimethyl-2-thiouracil, 6-methyl-5-propyl-2-thiouracil, 5-propylthiouracil, 5-methyl-6-butyl-2-thiouracil, 5-hexyl-2-thiouracil, 5-ethyl-2-thiouracil, 1-methyl-2-thiouracil, 3-methyl-2-thiouracil, 1,3-dimethyl-2-thiouracil, 1,5-dimethyl-2-thiouracil, thiobarbital, 5-(2-methylpropyl)-5-ethyl-2-thiobarbituric acid, 1,3-diethyl-2-thiobarbituric acid, 1,3,5-trimethyl-2-thiobarbituric acid and 1,3-dimethyl-2-thiobarbituric acid, and more preferred are ethylenethiourea, propylenethiourea, 2-thiouracil and 2-thiobarbituric acid, which are respectively represented by the following structural formulae:

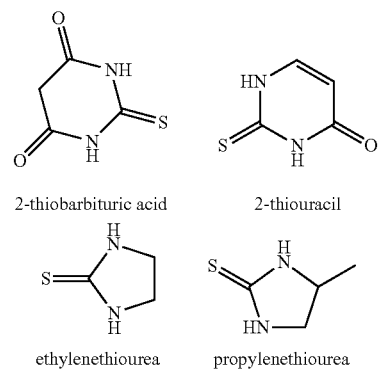

2-thiobarbituric acid     2-thiouracil ethylenethiourea     propylenethiourea

The concentration of the cyclic compound represented by general formula (I), which has a thiourea group and wherein N and N' are linked, to be used in the present invention is preferably 0.00001 to 1.5% by mass, more preferably 0.00005 to 0.5% by mass, and particularly preferably 0.0001 to 0.1% by mass relative to the total amount of the silicon etching liquid. When the concentration is 0.00001 to 1.5% by mass, silicon can be etched effectively.

As the silicon etching method of the present invention, usually employed is a method in which: an etching target is immersed in a heated etching liquid and taken out therefrom after a predetermined amount of time; the etching liquid adhering to the target is washed away with water or the like; and then water adhering to the target is dried. The etching temperature is preferably a temperature of 40° C. or higher and lower than the boiling point, more preferably 50° C. to 90° C., and particularly preferably 70° C. to 90° C. When the etching temperature is within this range, silicon can be etched effectively. By increasing the temperature of the etching liquid, the etching rate is increased, but appropriate treatment temperature may be suitably determined in view of suppression of composition change of the etching liquid to a low level and the like.

The etching time can be suitably selected depending on etching conditions and a target for etching. The etching time is usually 1 to 300 minutes, preferably 10 to 180 minutes, more preferably 10 to 120 minutes, and particularly preferably 20 to 90 minutes, but appropriate treatment time may be suitably determined.

The target of the etching treatment in the present invention is a substrate containing single crystal silicon, wherein single crystal silicon exists in the whole area or a partial area of the substrate.

Note that according to the present invention, reduction in the silicon etching rate can be suppressed in both the case where copper as a wiring material is exposed on the surface of the substrate from the start and the case where copper in the inner portion of the substrate is exposed on the surface by silicon etching. Single crystal silicon may be in a state of a single layer or multi-layer lamination. Substrates obtained by ion-doping the whole area or a partial area of these substrates are also the target of the etching treatment. In addition, when a material such as a silicon oxide film, a silicon nitride film and a organosilicon film or a metal film such as an aluminium film, a chromium film and a gold film exists on the surface or in the inner portion of the above-described target to be etched, such products are also included in the target of the etching treatment of the present invention.

EXAMPLES

Hereinafter, the present invention will be more specifically described by way of examples and comparative examples. The etching target used for evaluation is a single crystal silicon (100) (sometimes referred to as just "silicon (100)") wafer. One surface of this silicon (100) wafer is in the state where the whole surface thereof is covered with a protective film made of a thermal silicon oxide film, and the other surface of the wafer has a pattern shape, wherein the silicon surface (0.25 cm×0.25 cm) is regularly exposed by removal of a part of the thermal silicon oxide film by dry etching. Immediately prior to the etching treatment, this silicon (100) wafer was immersed in an aqueous solution of 1% by mass of hydrofluoric acid at 23° C. for 15 minutes, and then rinsed with ultrapure water and dried. By this treatment with the aqueous solution of hydrofluoric acid, a natural silicon oxide film produced on the surface of the silicon surface-exposed portion of the pattern shape was removed, and then the next etching treatment was carried out.

Method for Etching Single Crystal Silicon (100) Wafer and Method for Calculating Etching Rate (SiE.R.)

40 g of an etching liquid (described later) was put into a container made of polytetrafluoroethylene, and the container was immersed in a hot water bath to heat the etching liquid to 80° C. After the temperature of the etching liquid reached 80° C., a single crystal silicon (100) wafer (1 cm×1 cm) and a thin piece of copper (0.5 cm×0.5 cm, thickness of copper: 6000 Å) were simultaneously immersed in the etching liquid and subjected to the immersion treatment for 30 minutes. After that, the single crystal silicon (100) wafer was taken out from the etching liquid, and rinsed with ultrapure water and dried. The single crystal silicon (100) wafer after subjected to the etching treatment was in a state where the pattern portion was depressed compared to the surrounding area due to etching of single crystal silicon, and by measuring the difference in height between the etched portion and the unetched portion, the etching depth of the single crystal silicon (100) surface for 30 minutes was obtained. The value obtained by dividing the etching depth by 30 was calculated as the etching rate of the single crystal silicon (100) surface (unit: µm/min).

Examples 1-13 and Comparative Examples 1-4

The etching treatment was carried out using etching liquids described in Table 1. The results are shown in Table 1. The structural formulae of "cyclic compounds represented by general formula (I), which have a thiourea group and wherein N and N' are linked" used in Examples 1-13 are shown below. In Comparative Examples 1-4, in which none of the cyclic compounds represented by general formula (I), which have a thiourea group and wherein N and N' are linked is contained, the etching rate was obviously lower compared to corresponding Examples 1-13.

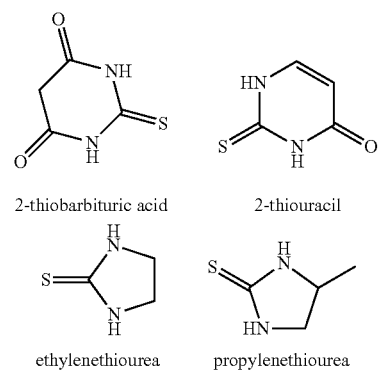

2-thiobarbituric acid     2-thiouracil ethylenethiourea     propylenethiourea

TABLE 1

Table 1 Cu piece and Si E.R.

| | Alkaline hydroxide | Concentration of alkaline hydroxide (% by mass) | Concentration of hydroxylamine (% by mass) | Compound having a thiourea group | Concentration of the compound having a thiourea group (% by mass) | Si E.R. (µm/min) |
|---|---|---|---|---|---|---|
| Example 1 | KOH | 24 | 10 | 2-thiouracil | 0.1 | 4.1 |
| Comparative Example 1 | KOH | 24 | 10 | not contained | — | 1.5 |
| Example 2 | KOH | 15 | 10 | 2-thiouracil | 0.1 | 3.7 |
| Comparative Example 2 | KOH | 15 | 10 | not contained | — | 3.0 |
| Example 3 | KOH | 35 | 10 | 2-thiouracil | 0.1 | 4.2 |
| Comparative Example 3 | KOH | 35 | 10 | not contained | — | 2.6 |
| Example 4 | KOH | 24 | 5 | 2-thiouracil | 0.1 | 2.7 |
| Comparative Example 4 | KOH | 24 | 5 | not contained | — | 2.0 |
| Example 5 | KOH | 24 | 10 | 2-thiouracil | 0.0001 | 4.0 |
| Example 6 | KOH | 24 | 10 | 2-thiouracil | 0.001 | 4.2 |
| Example 7 | KOH | 24 | 10 | 2-thiouracil | 0.01 | 4.1 |
| Example 8 | KOH | 24 | 10 | 2-thiouracil | 0.2 | 4.0 |
| Example 9 | KOH | 24 | 10 | 2-thiouracil | 0.5 | 4.0 |
| Example 10 | KOH | 24 | 10 | 2-thiouracil | 1 | 3.8 |
| Example 11 | KOH | 24 | 10 | ethylenethiourea | 0.1 | 4.0 |
| Example 12 | KOH | 24 | 10 | propylenethiourea | 0.1 | 4.0 |
| Example 13 | KOH | 24 | 10 | 2-thiobarbituric acid | 0.1 | 4.1 |

Immersion temperature: 80° C., immersion time: 30 minutes
KOH: potassium hydroxide
Si E.R.: silicon etching rate Examples 14-20 and Comparative Example 5

The process was carried out in a manner similar to that in Examples 1-13 except that 0.0001% by mass of copper sulfate was contained in etching liquids described in Table 2 (no thin piece of copper was included). The results are shown in Table 2.

In Examples 14-20, cyclic compounds represented by general formula (I), which have a thiourea group and wherein N and N' are linked, had the performance of suppressing reduction in the etching rate not only in the case where a thin piece of copper coexisted in the etching liquid, but also in the case where copper had been dissolved in the etching liquid.

However, in Comparative Example 5 (none of the cyclic compounds represented by general formula (I), which have a thiourea group and wherein N and N' are linked was added), the etching rate was obviously lower compared to Examples 14-20, in which one of the cyclic compounds represented by general formula (I), which have a thiourea group and wherein N and N' are linked was added.

of copper: 6000 Å), the thickness of which had been measured in advance by a X-ray fluorescence spectrometer, was simultaneously immersed in the etching liquid and subjected to the immersion treatment for 60 minutes. After that, the thin piece of copper was taken out from the etching liquid, and rinsed with ultrapure water and dried. The thickness of the thin piece of copper was measured by the X-ray fluorescence spectrometer again to obtain the difference between the film thicknesses before and after the treatment, thereby obtaining the etching depth of the thin piece of copper for 60 minutes. The value obtained by dividing the etching depth by 60 was calculated as the etching rate of copper (unit: Å/min). In the case where the cyclic compound represented by general formula (I), which has a thiourea group and wherein N and N' are linked was contained in the etching liquid, the etching rate of copper was lower than 1 Å/min, but in the case where the cyclic compound represented by general formula (I), which has a thiourea group and wherein N and N' are linked was not contained, the etching rate of copper was 10 Å/min or

TABLE 2

Table 2 Addition of Cu and Si E.R.

|  | Alkaline hydroxide | Concentration of alkaline hydroxide (% by mass) | Concentration of hydroxylamine (% by mass) | Compound having a thiourea group | Concentration of the compound having a thiourea group (% by mass) | Concentration of copper sulfate added (% by mass) | Si E.R. (μm/min) |
|---|---|---|---|---|---|---|---|
| Example 14 | KOH | 24 | 10 | 2-thiouracil | 0.1 | 0.0001 | 4.0 |
| Example 15 | KOH | 24 | 10 | 2-thiouracil | 0.01 | 0.0001 | 4.1 |
| Example 16 | KOH | 24 | 10 | 2-thiouracil | 0.001 | 0.0001 | 4.1 |
| Example 17 | KOH | 24 | 10 | 2-thiouracil | 0.1 | 0.0001 | 4.2 |
| Example 18 | KOH | 24 | 10 | ethylenethiourea | 0.1 | 0.0001 | 4.3 |
| Example 19 | KOH | 24 | 10 | propylenethiourea | 0.1 | 0.0001 | 4.1 |
| Example 20 | KOH | 24 | 10 | 2-thiobarbituric acid | 0.1 | 0.0001 | 4.5 |
| Comparative Example 5 | KOH | 24 | 10 | not contained | — | 0.0001 | 1.2 |

Immersion temperature: 80° C., immersion time: 30 minutes
KOH: potassium hydroxide
Si E.R.: silicon etching rate Examples 21-26 and Comparative Example 6

Method for Etching Thin Piece of Copper and Method for Calculating Etching Rate 40 g of an etching liquid described in Table 3 was put into a container made of polytetrafluoroethylene, and the container was immersed in a hot water bath to heat the etching liquid to 80° C. After the temperature of the etching liquid reached 80° C., a solid copper film (2 cm×2 cm, thickness higher. Based on this, it was found that the cyclic compound represented by general formula (I), which has a thiourea group and wherein N and N' are linked, exerts not only the effect of suppressing reduction in the silicon etching rate even when copper as the wiring material coexists, but also the effect of preventing dissolution of copper as the wiring material. The values of the silicon etching rate were equivalent to those of Tables 1 and 2 (omitted in the table).

TABLE 3

Table 3 Cu E.R.

|  | Alkaline hydroxide | Concentration of alkaline hydroxide (% by mass) | Concentration of hydroxylamine (% by mass) | Compound having a thiourea group | Concentration of the compound having a thiourea group (% by mass) | Cu E.R. (Å/min) |
|---|---|---|---|---|---|---|
| Example 21 | KOH | 24 | 10 | 2-thiouracil | 0.001 | <1 |
| Example 22 | KOH | 24 | 10 | 2-thiouracil | 0.01 | <1 |
| Example 23 | KOH | 24 | 10 | 2-thiouracil | 0.1 | <1 |
| Example 24 | KOH | 24 | 10 | ethylenethiourea | 0.1 | <1 |
| Example 25 | KOH | 24 | 10 | propylenethiourea | 0.1 | <1 |
| Example 26 | KOH | 24 | 10 | 2-thiobarbituric acid | 0.1 | <1 |
| Comparative Example 6 | KOH | 24 | 10 | not contained | — | 16.2 |

Immersion temperature: 80° C., immersion time: 60 minutes
KOH: potassium hydroxide
Cu E.R.: etching rate of solid copper film Examples 27-31 and Comparative Examples 7-8

Method for Measuring the Concentration of the Compound Having a Thiourea Group in Etching Liquid Before and after Storage with Heating A portion of an etching liquid described in Table 4 was divided and diluted with ultrapure water (concentration: about 0.00001% by mass). After that, it was subjected to the high-performance liquid chromatography measurement to measure the concentration of the compound having a thiourea group in the etching liquid, and it was regarded as the additive concentration before storage with heating. After that, 100 g of the etching liquid was put into a container made of polytetrafluoroethylene, and the container was immersed in a hot water bath at 50° C. and held for 72 hours. 72 hours later, the etching liquid was taken out, and the concentration of the compound having a thiourea group in the etching liquid after storage with heating was measured by means of high-performance liquid chromatography to obtain the concentration of the compound having a thiourea group decreased during storage with heating.

In the case of the cyclic compounds represented by general formula (I), which have a thiourea group and wherein N and N' are linked used in Examples 27-31, the concentration was very slightly changed during storage with heating, but in the case of the compounds, which have a thiourea group and wherein N and N' are not linked used in Comparative Examples 7-8, the concentration was significantly reduced. Based on this, it is understood that in the Examples, it is possible to provide an etching liquid, wherein stability of the etching liquid is not impaired. It is considered that this is because the compound having a thiourea group to be used in the present invention has a cyclic structure, leading to difficulty in decomposition.

to provide an etching liquid, wherein the etching rate of silicon is not reduced, copper as the wiring material is not etched and stability of the etching liquid is not impaired, and this is industrially useful.

The invention claimed is:

1. A silicon etching liquid, which anisotropically dissolves single crystal silicon, consisting essentially of (1) potassium hydroxide or sodium hydroxide, (2) a hydroxylamine and (3) a cyclic compound represented by formula (I):

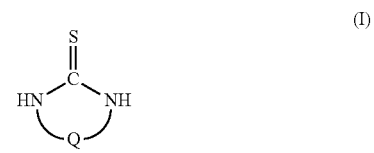

wherein in formula (I), Q represents an organic group having a saturated or unsaturated carbon-carbon bond, and is at least one selected from the group consisting of propylenethiourea, 2-thiouracil, 6-methyl-2-thiouracil, 5-butyl-6-ethyl-2-thiouracil, 5-butyl-6-methyl-2-thiouracil, 5-butyl-6-propyl-2-thiouracil, 5,6-dimethyl-2-thiouracil, 6-methyl-5-propyl-2-thiouracil, 5-propylthiouracil, 5-methyl-6-butyl-2-thiouracil, 5-hexyl-2-thiouracil, 5-ethyl-2-thiouracil, 1-methyl-2-thiouracil, 3-methyl-2-thiouracil, 1,3-dimethyl-2-thiouracil, 1,5-dimethyl-2-thiouracil, thiobarbital, 5-(2-methylpropyl)-5-ethyl-2-thiobarbituric acid, 1,3-diethyl-2-thiobarbituric acid, 1,3,5-trimethyl-2-thiobarbituric acid and 1,3-dimethyl-2-thiobarbituric acid.

TABLE 4

Table 4 Concentration of the compound having a thiourea group before and after storage with heating

| | Alkaline hydroxide | Concentration of alkaline hydroxide (% by mass) | Concentration of hydroxylamine (% by mass) | Compound having a thiourea group | Concentration of the compound having a thiourea group before heating (% by mass) | Concentration of the compound having a thiourea group after heating (% by mass) | Concentration of the compound having a thiourea group decreased during storage with heating (% by mass) |
|---|---|---|---|---|---|---|---|
| Example 27 | KOH | 24 | 10 | 2-thiouracil | 0.1045 | 0.1038 | 0.0007 |
| Example 28 | KOH | 24 | 10 | 2-thiouracil | 0.0118 | 0.0117 | 0.0002 |
| Example 29 | KOH | 24 | 10 | ethylenethiourea | 0.1010 | 0.1006 | 0.0004 |
| Example 30 | KOH | 24 | 10 | propylenethiourea | 0.1024 | 0.1017 | 0.0007 |
| Example 31 | KOH | 24 | 10 | 2-thiobarbituric acid | 0.1004 | 0.0982 | 0.0022 |
| Comparative Example 7 | KOH | 24 | 10 | thiourea | 0.1061 | 0.0007 | 0.1054 |
| Comparative Example 8 | KOH | 24 | 10 | N-methylthiourea | 0.1030 | 0.0006 | 0.1024 |

Immersion temperature: 50° C., immersion time: 72 hours
KOH: potassium hydroxide

INDUSTRIAL APPLICABILITY

According to the present invention, in silicon etching in which copper is included as a wiring material, it is possible 2. The silicon etching liquid according to claim 1, wherein said (3) the cyclic compound represented by formula (I), is at least one selected from the group consisting of propylenethiourea, and 2-thiouracil.

3. The silicon etching liquid according to claim 1, wherein the concentration of said (1) potassium hydroxide or sodium hydroxide is 7 to 45% by mass, the concentration of said (2) the hydroxylamine is 5 to 15% by mass and the concentration of said (3) the cyclic compound represented by general formula (I), is 0.00001 to 1.5% by mass.

* * * * *